United States Patent
Isberg et al.

(10) Patent No.: US 7,402,206 B2
(45) Date of Patent: Jul. 22, 2008

(54) METHOD OF SYNTHESIZING A COMPOUND OF THE FORMULA $M_{N+1}AX_N$, FILM OF THE COMPOUND AND ITS USE

(75) Inventors: Peter Isberg, Västerås (SE); Jens-Petter Palmquist, Uppsala (SE); Ulf Jansson, Uppsala (SE); Lars Hultman, Linköping (SE); Jens Birch, Linköping (SE); Timo Seppänen, Linköping (SE)

(73) Assignee: ABB AB, Västerås (SE)

( * ) Notice: Subject to any disclaimer, the term of this patent is extended or adjusted under 35 U.S.C. 154(b) by 339 days.

(21) Appl. No.: 10/497,234

(22) PCT Filed: Dec. 2, 2002

(86) PCT No.: PCT/SE02/02215

§ 371 (c)(1),
(2), (4) Date: Nov. 22, 2004

(87) PCT Pub. No.: WO03/046247

PCT Pub. Date: Jun. 5, 2003

(65) Prior Publication Data

US 2005/0076825 A1    Apr. 14, 2005

(30) Foreign Application Priority Data

Nov. 30, 2001   (SE)   .................................. 0104044

(51) Int. Cl.
*C30B 23/02*    (2006.01)
*C30B 23/00*    (2006.01)

(52) U.S. Cl. .............................. 117/84; 117/88; 117/90; 117/91; 117/92; 117/93; 117/99; 117/103; 117/108; 117/951; 117/952; 117/949

(58) Field of Classification Search .................. 117/84, 117/88, 89, 90, 91, 92, 93, 99, 103, 108, 117/951, 952, 949
See application file for complete search history.

(56) References Cited

U.S. PATENT DOCUMENTS 4,961,529 A    10/1990   Gottselig et al.

(Continued)

FOREIGN PATENT DOCUMENTS

EP    0448720 A1    10/1991

(Continued)

OTHER PUBLICATIONS

European Search Report; Jul. 5, 2006; 4 pages.

(Continued)

*Primary Examiner*—Robert M. Kunemund
*Assistant Examiner*—Matthew J Song
(74) *Attorney, Agent, or Firm*—Venable LLP; Eric J. Franklin

(57) ABSTRACT

A method of synthesizing or growing a compound having the general formula $M_{n+1}AX_n$ (16) where M is a transition metal, n is 1, 2, 3 or higher, A is an A-group element and X is carbon, nitrogen or both, which comprises the step of exposing a substrate to gaseous components and/or components vaporized from at least one solid source (13, 14, 15) whereby said components react with each other to produce the $M_{n+1}AX_n$ (16) compound.

34 Claims, 2 Drawing Sheets

U.S. PATENT DOCUMENTS

| | | | |
|---|---|---|---|
| 5,428,882 A * | 7/1995 | Makowiecki et al. | 29/527.5 |
| 5,580,653 A | 12/1996 | Tanaka et al. | |
| 5,885,541 A * | 3/1999 | Bates | 423/446 |
| 6,063,185 A | 5/2000 | Hunter | |
| 2002/0068488 A1 * | 6/2002 | Tuller et al. | 439/775 |

FOREIGN PATENT DOCUMENTS

| | | | |
|---|---|---|---|
| EP | 448720 A1 * | 10/1991 | |
| EP | 0588350 A2 | 3/1994 | |

OTHER PUBLICATIONS

T. Goto et al; "Chemically Vapor Deposited $Ti_3SiO_2$"; Materials Research Bulletin, 1987; pp. 1195-1201; vol. 22.

Michel W. Barsoum; The $M_{N+1}AX_N$ Phases: A New Class of Solids; Thermodynamically Stable Nanolaminates; Program Solid St. Chem; 2000; pp. 201-281; vol. 28.

T. Goto et al; "Chemically Vapor Deposited $Ti_3SiO_2$"; Materials Research Bulletin, 1987; pp. 1195-1201; vol. 22; The Research Institue for Iron, Steel and Other Metals, Tohku Univeristy, 980 Sendai, Japan.

Michel W. Barsoum; The $M_{n+1}AX_N$ Phases: A New Class of Solids; Thermodynamically Stable Nanolaminates; Program Solid St. Chem; 2000; pp. 201-281; vol. 28; Department of Materials Engineering, Drexel University, Philadelphia, PA 19104.

* cited by examiner

METHOD OF SYNTHESIZING A COMPOUND OF THE FORMULA $M_{N+1}AX_N$, FILM OF THE COMPOUND AND ITS USE

The present invention relates to a method of synthesizing or growing a compound having the general formula $M_{n+1}AX_n$, where M is at least one transition metal, n is 1, 2, 3 or higher, A is at least one A-group element and X is carbon or nitrogen, or both carbon and nitrogen.

BACKGROUND OF THE INVENTION

Recent studies have shown that ternary and quaternary compounds having the general formula $M_{n+1}AX_n$ exhibit unusual and exceptional mechanical properties as well as advantageous electrical, thermal and chemical properties. Despite having high stiffness these ceramics are readily machinable, resistant to thermal shock, unusually damage tolerant, have low density and are thermodynamically stable at high temperatures (up to 2300° C.).

$M_{n+1}AX_n$ compounds have layered and hexagonal structures with $M_2X$ layers interleaved with layers of pure A and it is this structure, comprising exceptionally strong "metallic" M-X bonds together with relatively weak M-A bonds, which gives rise to their unusual combination of properties.

$M_{n+1}AX_n$ compounds are characterized according to the number of transition metal layers separating the A-group element layers: in "211" compounds there are two such transition metal layers, in "312" compounds there are three and in "413" compounds there are four. 211 compounds are the most predominant, these include $Ti_2AlC$, $Ti_2AlN$, $Hf_2PbC$, $Nb_2AlC$, $(Nb,Ti)_2AlC$, $Ti_2AlN_{0.5}C_{0.5}$, $Ti_2GeC$, $Zr_2SnC$, $Ta_2GaC$, $Hf_2SnC$, $Ti_2SnC$, $Nb_2SnC$, $Zr_2PbC$ and $Ti_2PbC$. The only known 312 compounds are $Ti_3AlC_2$, $Ti_3GeC_2$, $Ti_3SiC_2$. $Ti_4AlN_3$ and $Ti_4SiC_3$ are the only 413 compound known to exist at present. A very large number of solid solution permutations and combinations are also conceivable as it is possible to form solid solutions on the M-sites, the A-sites and the X-sites of these different phases.

Michel Barsoum has synthesized, characterized and published data on the $M_{n+1}AX_n$ phases named above in bulk form ["The $M_{n+1}AX_n$ Phases: A New Class of Solids", Progressive Solid State Chemistry, Vol. 28 pp201-281, 2000]. His measurements on $Ti_3AlC_2$ show that it has a significantly higher thermal conductivity and a much lower electrical resistivity than titanium and, like other $M_{n+1}AX_n$ phases, it has the ability to contain and confine damage to a small area thus preventing/limiting crack propagation through the material. Its layered structure and the fact that bonding between the layers is weaker than along the layers (as in graphite) give rise to a very low friction coefficient, even after six months exposure to the atmosphere. Polycrystalline samples however do not have such a low friction coefficient and tend to be brittle at room temperature.

Barsoum's synthesis process, for the $M_{n+1}AX_n$ phases he studied, involved the simultaneous application of high temperature and high pressure to starting materials in bulk form in a hot isostatic press. The starting materials react under pressure to produce $M_{n+1}AX_n$ phases. The methods used for producing epitaxial binary carbide films (such as chemical vapour deposition, CVD and physical vapour deposition, PVD) are carried out at high temperatures (1000-1400° C.). Films grown or synthesized at lower temperatures tend to be amorphous or compact grained. As yet there is no method that is able to produce crystalline/epitaxial thin films or coatings of $M_{n+1}AX_n$ at a relatively low temperature.

SUMMARY OF THE INVENTION

It is an object of this invention to synthesize or grow a compound having the general formula $M_{n+1}AX_n$ where M is at least one transition metal, n is 1, 2, 3 or higher, A is at least one A-group element and X is carbon, nitrogen or both, in the form of thin films or coatings.

This and other objects of the invention are achieved by utilizing a method that comprises the step of exposing a substrate to gaseous components and/or components vaporized from at least one solid source whereby said components react with each other to produce the $M_{n+1}AX_n$ compound. In a preferred embodiment of the invention the method comprises the step of vaporizing at least one transition metal, at least one A-group element and at least one X element from at least one source.

According to a further preferred embodiment of the invention the substrate comprises one of the following materials: a metal, such as copper, aluminium, nickel or gold, a non-metal, a semiconductor such as GaAs, a ceramic, a polymer, an oxide, a binary metal carbide, nitride or carbonitride, a $M_{n+1}AX_n$ compound, MgO, SiC, oriented graphite, $C_{60}$, sapphire or silicon.

In another preferred embodiment of the invention the substrate comprises a seed layer (i.e. buffer layer, template layer, nucleation layer) on which the $M_{n+1}AX_n$ compound is synthesized or grown. The seed layer is produced by any suitable means either ex-situ or in situ or by a combination of both ex situ and in situ steps. This means that a suitable seed layer is produced prior to carrying out the method of the present invention, or it is produced in situ prior to synthesizing or growing the $M_{n+1}AX_n$ compound, or a previously applied surface component is treated and thus modified in situ to promote the nucleation, formation or growth of the $M_{n+1}AX_n$ compound. According to a preferred embodiment of the invention the seed layer comprises a material exhibiting an epitaxial relationship or a preferred crystallographic orientation to the $M_{n+1}AX_n$ compound to be synthesized. In a preferred embodiment the seed layer comprises a transition metal carbide or nitride or carbonitride for example titanium carbide or titanium nitride, oriented graphite, $C_{60}$ or at least one of the components of the $M_{n+1}AX_n$ compound.

According to another preferred embodiment of the invention the components required to produce the seed layer and/or the $M_{n+1}AX_n$ compound are vaporized from at least one solid source by physical vapour deposition. In a further preferred embodiment of the invention at least one of the components required to produce the seed layer and/or the $M_{n+1}AX_n$ compound is vaporized from a $M_{n+1}AX_n$ target.

According to a preferred embodiment of the invention, where carbon is required, the carbon source is either solid, for example high purity graphite, or gaseous, for example a hydrocarbon gas. In a further preferred embodiment of the invention it comprises at least one of the following nanostructures: buckyballs; $C_{60}$, $C_{70}$, nanotubes, nanoropes, nanofibres, azafullerenes or any other carbon nanostructures having a diameter between 0.1 and 100 nm. Such nanostructures may be formed from carbon sources or suitable precursors by an electric arc process, sputtering, catalytic pyrolysis, electron beam evaporation, vaporization or laser ablation. In another preferred embodiment the carbon source comprises doped nanostructures in order to modify the chemical composition of the subsequently produced $M_{n+1}AX_n$ and thereby its mechanical, electrical or thermal properties.

According to other preferred embodiments of the invention an atomic flow of carbon is obtained using a PVD process or from a carbon-containing gas such as a hydrocarbon. In another preferred embodiment of the invention the carbon source is produced from a suitable precursor such as metal-fullerene nanoclusters.

The composition and crystallinity of the $M_{n+1}AX_n$ compound formed on the substrate is controlled by the ratio of the components reaching the substrate, the seed layer used, and the temperature of the substrate. The method of the present invention renders relatively low substrate temperatures possible due the highly reactive atomic state of the components that form the $M_{n+1}AX_n$ compound and the high purity of the carbon sources used. This means for example that epitaxial films can be obtained at relatively low temperatures.

In a preferred embodiment of the invention the substrate is heated to a temperature between room temperature and 1400° C., preferably 800° C. or is lower. According to a yet further preferred embodiment of the invention the temperature to which said substrate is heated is changed while the $M_{n+1}AX_n$ compound is being grown. Alternatively the substrate surface is treated with plasma or bombarded with energetic particles such as ions, electrons, neutral atoms, molecules or clusters to promote growth of the seed layer.

In a preferred embodiment of the invention the method comprises the further step of periodically changing the nature or the ratio of the components supplied to the nucleation surface. By "nature of the components" it is meant that the M, A and/or X components used are changed to give rise to a structure comprising a combination of different $M_{n+1}AX_n$ compounds. For example the nature or ratio of the components is changed in a stepwise manner to produce a laminate with distinct layers of the same or different $M_{n+1}AX_n$ compound(s) and layers of materials (M) such as metals, binary carbides or nitrides. For example the nature or ratio of components supplied to said substrate is changed alternately in order to produce a multi-layer laminate comprising alternate layers of a $M_{n+1}AX_n$ compound and layers of materials such as metals, $M_{n+1}AX_n$ compounds, binary carbides or nitrides.

Laminates having the following structures, as well as permutations of these structures can be easily produced:

$M/M_{n+1}AX_n/M/M_{n+1}AX_n/M/M_{n+1}AX_n/M$ ... etc.
$MX/M_{n+1}AX_n/MX/M_{n+1}AX_n/MX/M_{n+1}AX_n/MX$ ... etc.
$AX/M_{n+1}AX_n/AX/M_{n+1}AX_n/AX/M_{n+1}AX_n/AX$ ... etc.

An alternating metal-$M_{n+1}AX_n$ structure can, for example, be achieved by alternately breaking off the flow of the carbon and A-group components to the substrate.

Alternatively the method of the present invention comprises the further step of gradually changing the nature or the ratio of the components supplied to the substrate in order to produce a graded laminate. The method of the present invention is carried out in a vacuum, noble gas, nitrogen- or carbon-containing gas atmosphere.

This method is intended for the synthesis or growth of both epitaxial and non-epitaxial compounds i.e. where the $M_{n+1}AX_n$ layer synthesized/grown exhibits an epitaxial relationship or preferred crystallographic orientation to grains in a substrate, a seed layer or to a single crystal substrate. The method described can be used to produce thin films that are one $M_{n+1}AX_n$ crystallographic unit cell to a few millimeters thick.

Such a method is suitable for used in the manufacture of electric contacts, films or coatings having a low coefficient of friction, anti-stick-films, lubricating films or coatings in micromechanics or catalytically active films. It can be used for the manufacture of protective films or coatings that are at least one of the following corrosion-resistant, thermally stable, wear resistant, impact resistant or oxidation resistant $M_{n+1}AX_n$ compounds are capable of supporting an external load or further film deposition such as metallisation. They are suitable as coatings for devices in applications where dimensional stability under rotation or translation is important such as in disk drives and sensor heads. They can be used as lubricating films or coatings in micro-mechanical applications for example on hard disks.

They are also suitable as coatings for commutating brushes for DC motors and applications where contact surfaces move while bearing against each other in establishing and/or breaking electrical contact such as in circuit spring-loaded contacts in circuit breakers or spring contacts to printed is circuit boards. Due to the low friction coefficient of these materials, the friction forces to be overcome when establishing or breaking electric contact will be very low which means that power consumption will be low and the wear on the contact surfaces will be negligible. They are equally suitable as surface coatings for cutting tools as they provide a wear resistant, hard and impact resistant surface that does not require lubrication or cooling while cutting.

BRIEF DESCRIPTION OF THE DRAWING

A greater understanding of the present invention may be obtained by reference to the accompanying drawing, when considered in conjunction with the subsequent description of the preferred embodiments, in which.

DESCRIPTION OF THE PREFERRED EMBODIMENTS

Figure 1:
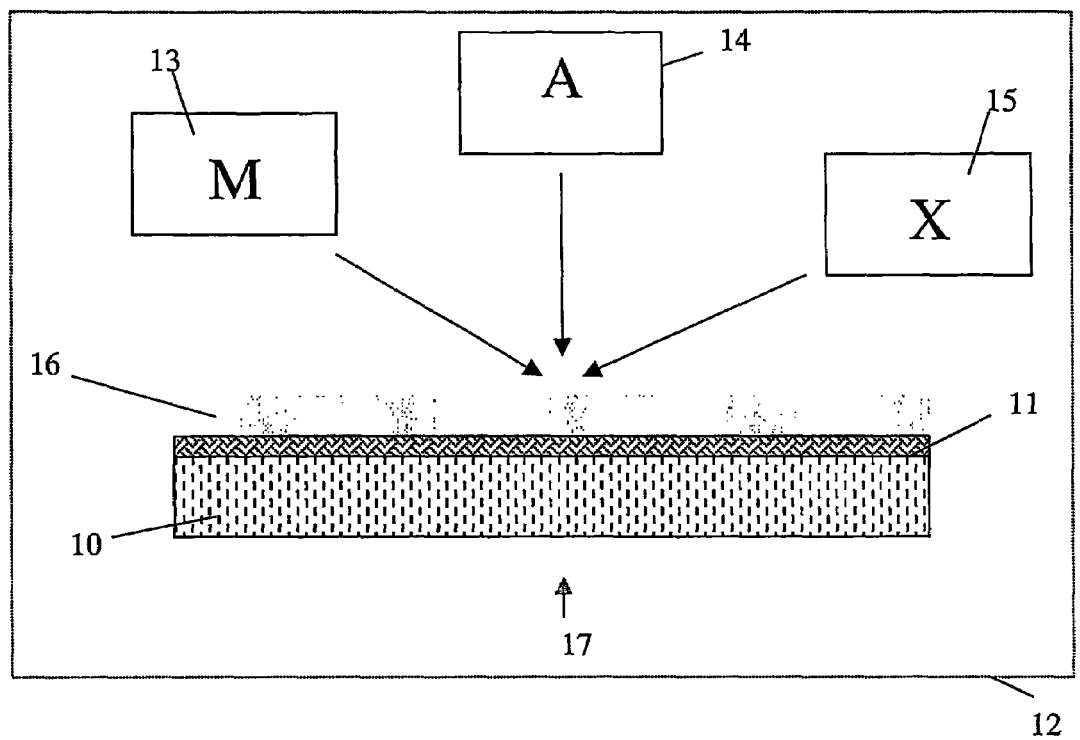
FIG. 1 is a schematic representation of the method of the present invention.

FIG. 1 shows a substrate 10, comprising a seed layer 11, contained in a vacuum chamber 12. The substrate with the seed layer is exposed to at least one transition metal (M), such as titanium or two transition metals such as titanium and vanadium, vaporized from a solid source 13, at least one A-group element (A) vaporized from a solid source 14 and carbon produced from by vaporization of a carbon source 15. The carbon source may for example comprise high-purity graphite, nanostructures or optionally doped nanostructures such as metal-fullerene clusters.

The transition metal and A-group element sources can be vaporized by a physical vapour deposition method for example. PVD processes involve the evaporation of at least one of the reactants in a high vacuum chamber ($10^{-3}$ to $10^{-6}$ mbar) by heating, sputtering or arc-evaporation. PVD methods include laser ablation in which a high-energy laser blasts material from a target and through a vapour to the substrate where the material is deposited. Other PVD approaches are sputter and arc deposition in which energetic ions bombard the surface of a target, generating a flux of target atoms.

The M, A and X components react with each other produce a compound having the general formula $M_{n+1}AX_n$, 16. A thin layer of $M_{n+1}AX_n$ is formed having an epitaxial or a non-epitaxial relationship with the seed layer 11 or another relationship favourable for the formation of said compound. The substrate 10 is heated 17 to the temperature conducive to the formation of the $M_{n+1}AX_n$ compound having the properties required in the as-deposited state or after subsequent processing. In the production of a film comprising at least one epitaxial layer of $Ti_3SiC_2$ for example, the substrate can be MgO and the seed layer can be TiC.

Figure 2:
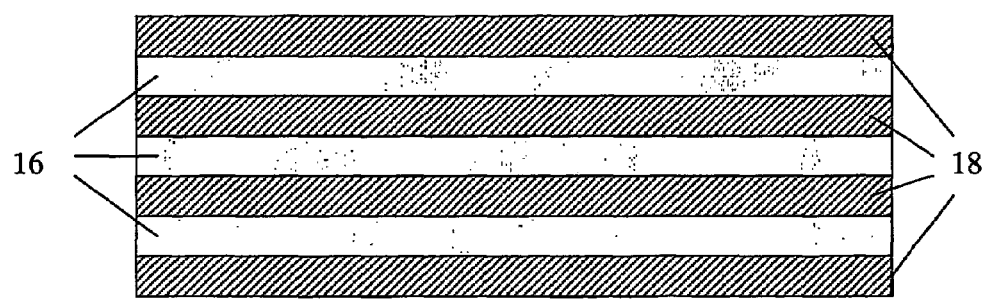
FIG. 2 depicts a structure produced using the method according to present invention.

FIG. 2 shows a laminate having alternating metal carbide layers (18), TiC for example and $M_{n+1}AX_n$, 16 layers. Such a structure is obtainable using the method of the present invention by periodically stopping the flow A components so as to form the metal carbide layers. The composition of the $M_{n+1}AX_n$ layers may be controlled by changing the ratio of the components reaching the substrate for example by changing the rate of evaporation from the carbon source or the power of a vaporization laser used to produce the one or more of the components. The properties of such a multi-layer structure will depend not only on the composition of the layers but also on the crystal structure and thickness of the layers. The non-$M_{n+1}AX_n$ layers 18 of such a laminate do not have to contain a binary metal carbide as in this example. These layers can comprise metals or metal nitrides, for example. Similarly all of the $M_{n+1}AX_n$ layers 16 do not have to comprise the same $M_{n+1}AX_n$ compound.

Figure 3:
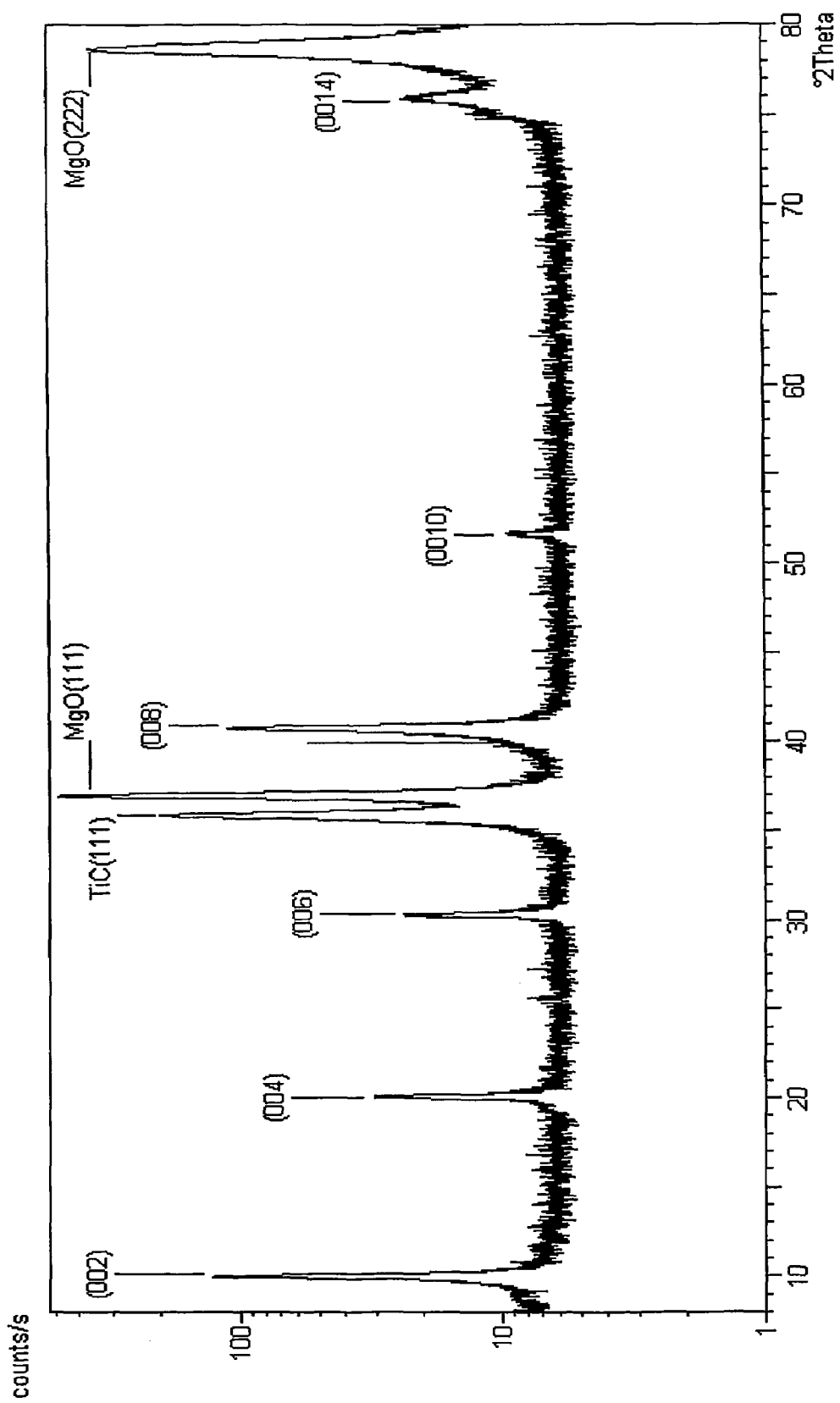
FIG. 3 shows an X-ray diffraction pattern of a $Ti_3SiC_2$ layer of approximately 100 nm thickness deposited on a TiC (111) seed layer on a MgO (111) substrate.

FIG. 3 shows an X-ray diffraction pattern of an epitaxial $Ti_3SiC_2$ layer of approximately 100 nm thickness deposited on a TiC (111) seed layer on a MgO (111) substrate. The graph shows that the $Ti_3SiC_2$ has a 0001 orientation. To the inventors' knowledge the sample that was used to obtain these XRD-results is the first ever epitaxial 312 film.

While only certain preferred features of the present invention have been illustrated and described, many modifications and changes will be apparent to those skilled in the art. It is therefore to be understood that all such modifications and changes of the present invention fall within the scope of the claims. For example the word "layer" should not be interpreted to mean only deposits that cover an entire surface but is intended to refer to any deposit of $M_{n+1}AX_n$ compound or seed layer material on any part of a surface.

The invention claimed is:

1. A method of synthesizing or growing a compound having the general formula $M_{n+1}AX_n$ where M is at least one transition metal, n is 1, 2, 3 or higher, A is at least one A-group element and X is carbon, nitrogen or both, the method comprising:
    producing a seed layer on a substrate by vaporizing components for producing the seed layer from at least one solid source by physical vapor deposition, the seed layer comprising at least one material exhibiting an epitaxial relationship or a preferred crystallographic orientation to the $M_{n+1}AX_n$ compound to be synthesized or grown and comprising a transition metal carbide or nitride or carbonitride or oriented graphite or $C_{60}$; and
    exposing the substrate to components vaporized from at least one solid source whereby said components, or said components in combination with at least one gaseous component, react with each other to produce the $M_{n+1}AX_n$ compound on the seed layer.

2. The method according to claim 1, further comprising:
    vaporizing at least one transition metal, at least one A-group element and at least one X element from at least one source.

3. The method according to claim 1, wherein said substrate comprises one of the following materials: a metal, a non-metal, a semiconductor, a ceramic, a polymer, an oxide, a binary metal carbide, nitride or carbonitride, a $M_{n+1}AX_n$ compound, MgO, SiC, oriented graphite, $C_{60}$, sapphire or silicon.

4. The method according to claim 1, wherein the seed layer is produced ex situ, in situ or by a combination of both ex situ and in situ steps.

5. The method according to claim 4, further comprising:
    initially producing a seed layer on the substrate prior to synthesizing or growing the $M_{n+1}AX_n$ compound thereon.

6. The method according to claim 4, wherein the components required to produce the $M_{n+1}AX_n$ compound are vaporized from at least one solid source by physical vapor deposition.

7. The method according to claim 4, wherein at least one of the components required to produce the seed layer and/or the $M_{n+1}AX_n$ compound is vaporized from a $M_{n+1}AX_n$ target.

8. The method according to claim 1, wherein where carbon is required, the carbon source comprises high-purity graphite.

9. The method according to claim 1, wherein where carbon is required, the carbon source is gaseous.

10. The method according to claim 1, wherein where carbon is required, the carbon source comprises at least one of the following nanostructures: buckyballs; $C_{60}$, $C_{70}$, nanotubes, nanoropes, azafullerenes or any other carbon nanostructure having a diameter between 0.1 and 100 nm.

11. The method according to claim 10, wherein the carbon source comprises nanostructures that are doped so as to modify the chemical composition of the subsequently produced $M_{n+1}AX_n$ compound and to improve the mechanical, electrical or thermal properties of said compound.

12. The method according to claim 11, wherein said substrate is heated to a temperature of 800° C. or lower.

13. The method according to claim 11, wherein the temperature to which said substrate is heated is changed while the $M_{n+1}AX_n$ compound is being grown.

14. The method according to claim 1, wherein where carbon is required, the carbon source is produced from a suitable precursor such as metal-fullerene nanoclusters.

15. The method according to claim 1, wherein said substrate is heated.

16. The method according to claim 1, wherein said substrate is treated with plasma or bombarded with energetic particles.

17. The method according to claim 16, wherein said energetic particles comprise ions, electrons, neutral atoms, molecules or clusters.

18. The method according to claim 1, further comprising:
    periodically changing the nature or the ratio of the components supplied to the nucleation surface to produce a multi-layer laminate comprising layers of a same or different $M_{n+1}AX_n$ compounds and layers of materials.

19. The method according to claim 18, wherein the nature or ratio of components supplied to said substrate is changed alternately in order to produce a multi-layer laminate comprising alternate layers of $M_{n+1}AX_n$ compounds and layers of materials.

20. The method according to claim 19, wherein said materials comprise metals, $M_{n+1}AX_n$ compounds, binary carbides or nitrides.

21. The method according to claim 18, wherein said layers of materials comprise metals, binary carbides or nitrides.

22. The method according to claim 1, further comprising:
    gradually changing the nature or the ratio of the components supplied to the substrate in order to produce a graded laminate.

23. The method according to claim 1, wherein said method is carried out in a vacuum, noble gas, nitrogen- or carbon-containing gas atmosphere.

24. A film produced by a method according to claim 1, wherein the film comprises at least one epitaxial $M_{n+1}AX_n$ layer.

25. The film according to claim 24, wherein said $M_{n+1}AX_n$ compound is produced as a film that is one $M_{n+1}AX_n$ crystallographic unit cell to a few millimeters thick.

26. A film produced by a method according to claim 1, wherein the film comprises at least one non-epitaxial $M_{n+1}AX_n$ layer.

27. The film according to claim 26, wherein said $M_{n+1}AX_n$ compound is produced as a film that is one $M_{n+1}AX_n$ crystallographic unit cell to a few millimeters thick.

28. Use of a method according to claim 1 for the manufacture of electric contacts.

29. Use of a method according to claim 1 for the manufacture of films or coatings having a low coefficient of friction.

30. Use of a method according to claim 1 for the manufacture of lubricating films, anti-stick films or coatings in micromechanics.

31. Use of a method according to claim 1 for the manufacture of protective films or coatings that are at least one of the following corrosion-resistant, thermally stable, wear resistant, impact resistant or oxidation resistant.

32. Use of a method according to claim 1 for the manufacture of catalytically active films.

33. A film produced by a method of synthesizing or growing a compound having the general formula $M_{n+1}AX_n$ where M is at least one transition metal, n is 1, 2, 3 or higher, A is at least one A-group element and X is carbon, nitrogen or both, wherein the method comprises exposing a substrate to components vaporized from at least one solid source whereby said components, or said components in combination with at least one gaseous component, react with each other to produce the $M_{n+1}AX_n$ compound, the film comprising:

at least one epitaxial $M_{n+1}AX_n$ layer.

34. The film according to claim 33, wherein said $M_{n+1}AX_n$ compound is produced as a film that is one $M_{n+1}AX_n$ crystallographic unit cell to a few millimeters thick.

* * * * *